United States Patent
Yasuda et al.

(10) Patent No.: US 8,536,002 B2
(45) Date of Patent: Sep. 17, 2013

(54) BIPOLAR TRANSISTOR IN BIPOLAR-CMOS TECHNOLOGY

(75) Inventors: Hiroshi Yasuda, Plano, TX (US); Berthold Staufer, Moosburg (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/567,552

(22) Filed: Aug. 6, 2012

(65) Prior Publication Data

US 2013/0032892 A1 Feb. 7, 2013

Related U.S. Application Data

(60) Provisional application No. 61/515,194, filed on Aug. 4, 2011.

(51) Int. Cl.
*H01L 21/8238* (2006.01)

(52) U.S. Cl.
USPC ............ 438/202; 438/207; 257/E21.696; 257/E27.015

(58) Field of Classification Search
USPC ........... 438/202, 203, 207, 357, 363, 365; 257/370, E21.379, E21.409, E21.696, E27.015
See application file for complete search history.

(56) References Cited

U.S. PATENT DOCUMENTS

| | | | | |
|---|---|---|---|---|
| 6,992,338 B1 * | 1/2006 | Yin et al. | | 257/197 |
| 7,115,459 B2 * | 10/2006 | Bae et al. | | 438/202 |
| 7,170,113 B2 * | 1/2007 | Noda | | 257/197 |
| 7,534,680 B2 * | 5/2009 | Kang et al. | | 438/202 |
| 2010/0032804 A1 * | 2/2010 | Balster et al. | | 257/586 |

* cited by examiner

*Primary Examiner* — Tuan N. Quach
(74) *Attorney, Agent, or Firm* — Jacqueline J. Garner; Wade J. Brady, III; Frederick J. Telecky, Jr.

(57) ABSTRACT

A process of forming an integrated circuit containing a bipolar transistor and an MOS transistor, by forming a base layer of the bipolar transistor using a non-selective epitaxial process so that the base layer has a single crystalline region on a collector active area and a polycrystalline region on adjacent field oxide, and concurrently implanting the MOS gate layer and the polycrystalline region of the base layer, so that the base-collector junction extends into the substrate less than one-third of the depth of the field oxide, and vertically cumulative doping density of the polycrystalline region of the base layer is between 80 percent and 125 percent of a vertically cumulative doping density of the MOS gate. An integrated circuit containing a bipolar transistor and an MOS transistor formed by the described process.

11 Claims, 7 Drawing Sheets

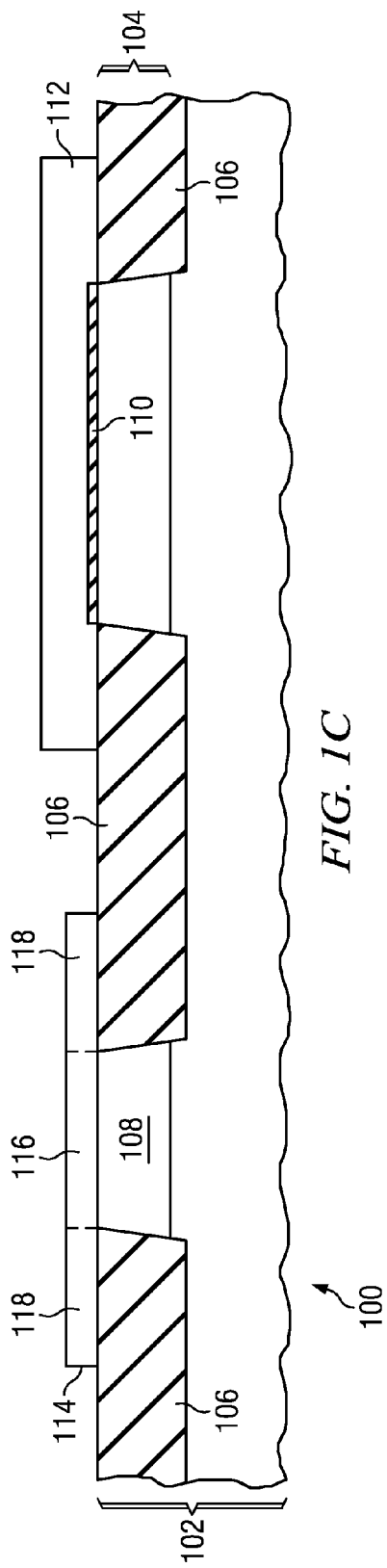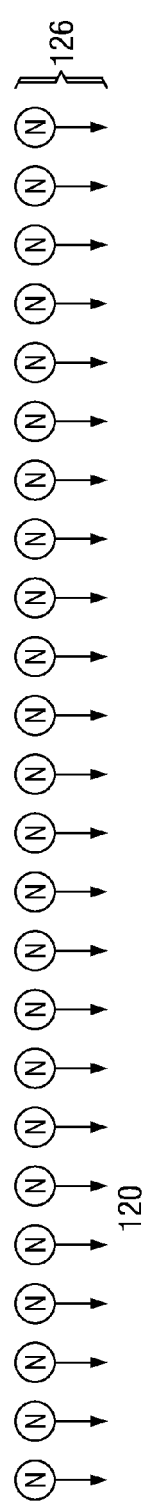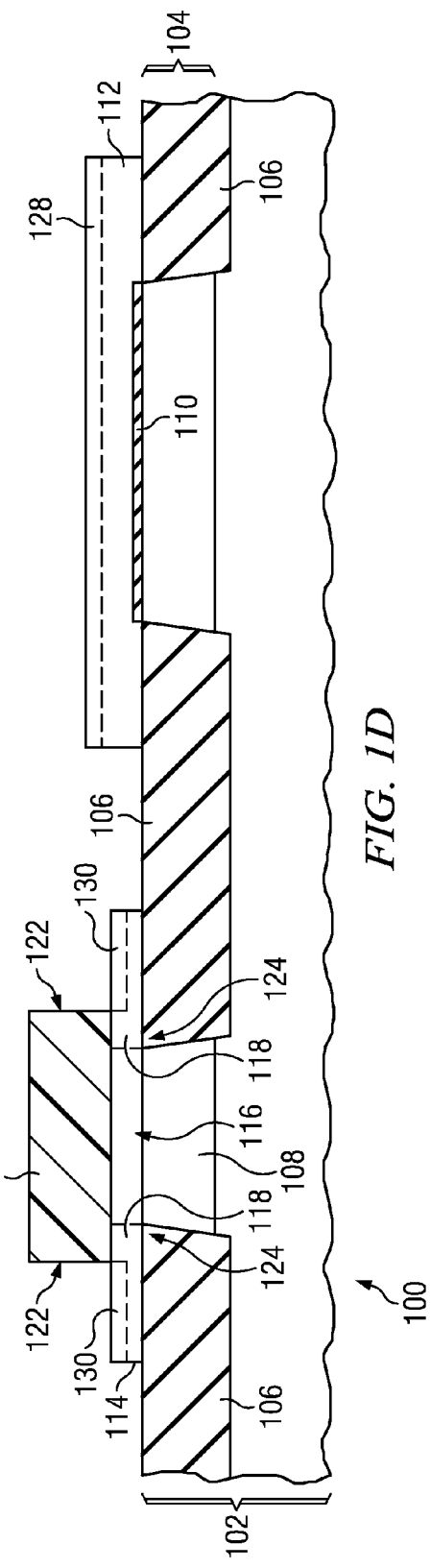
FIG. 1C
FIG. 1D

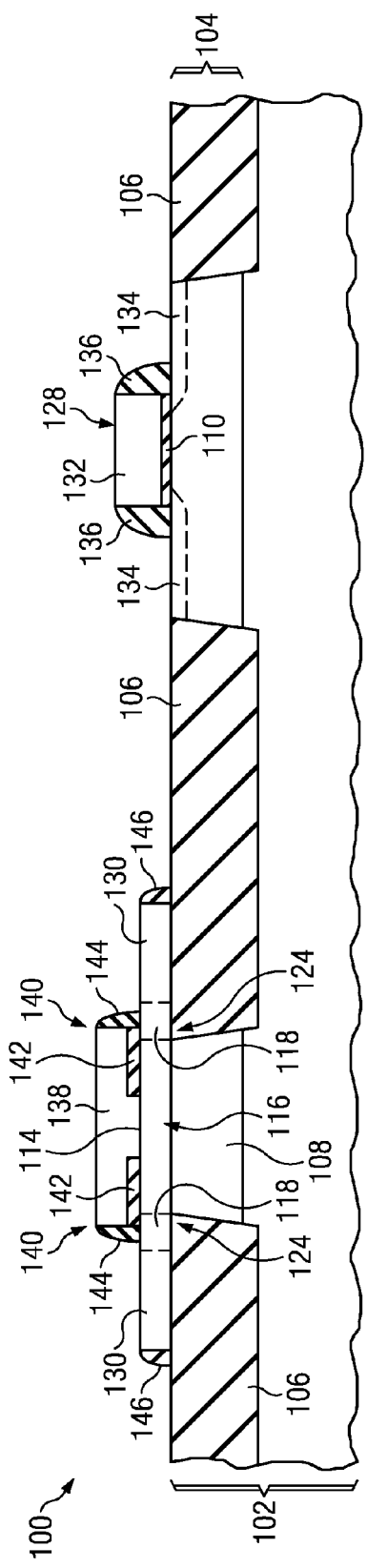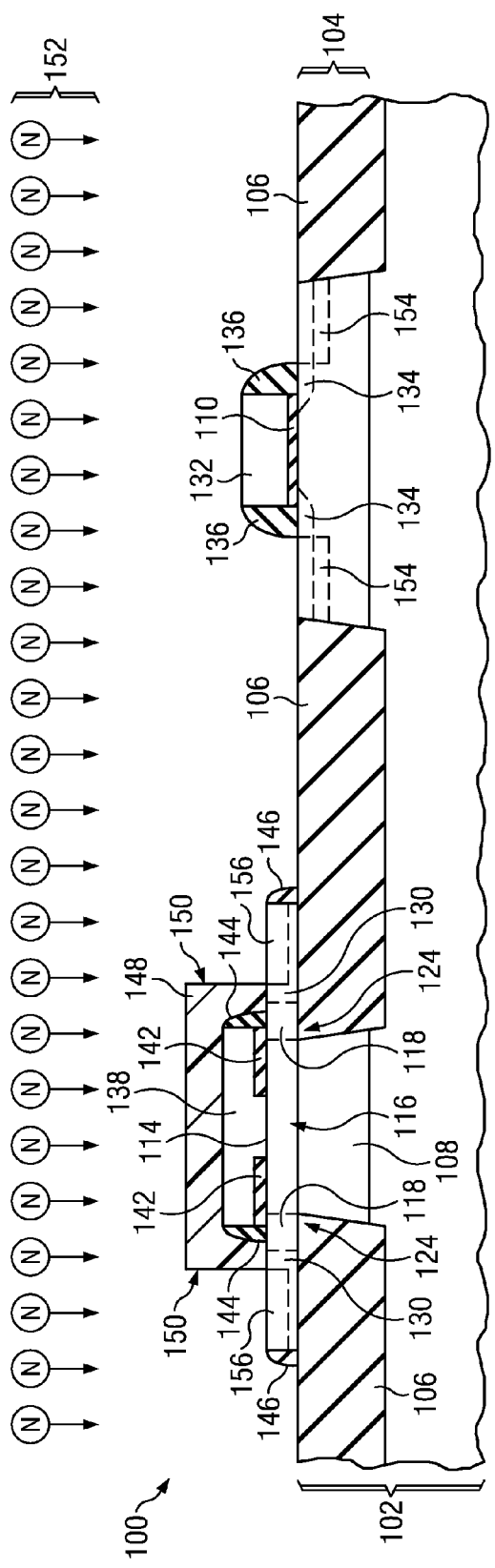

US 8,536,002 B2

BIPOLAR TRANSISTOR IN BIPOLAR-CMOS TECHNOLOGY

FIELD OF THE INVENTION

This invention relates to the field of integrated circuits. More particularly, this invention relates to integrated circuits containing bipolar transistors and MOS transistors.

BACKGROUND OF THE INVENTION

An integrated circuit may include bipolar transistors and metal oxide semiconductor (MOS) transistors. Regarding the bipolar transistors, it may be desirable to simultaneously attain desired levels of transfer frequency, collector-base breakdown voltage and base resistance. Regarding integration of the bipolar transistors and MOS transistors into the integrated circuit, it may be desirable to reduce fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed so as to include a bipolar transistor and an MOS transistor. The bipolar transistor may have a collector disposed in a substrate of the integrated circuit, abutted by field oxide. The bipolar transistor may further have a base on the collector and overlapping the adjacent field oxide, formed by a non-selective epitaxial process, so that a portion of the base on the collector is crystalline and a portion of the base on the field oxide is polycrystalline. The bipolar transistor may also have an emitter on the base. The MOS transistor may have a gate with an average doping density between 80 percent and 125 percent of an average dopant density in the polycrystalline region of the base over the field oxide.

The integrated circuit may be formed by forming field oxide at the top surface of the substrate so as to provide the collector between two adjacent field oxide regions. A base layer is then formed on the collector, overlapping the adjacent field oxide, using a non-selective epitaxial process, so that a portion of the base layer on the collector is crystalline and a portion of the base layer on the field oxide adjacent to the collector is polycrystalline. An ion implant operation is performed which provides dopants to the base by ion implanting dopants into the base layer in an area laterally separated from the collector while blocking the dopants from the base layer over the collector, and concurrently ion implanting dopants into a gate layer over an area for the MOS transistor. The gate layer is subsequently patterned to form a gate of the MOS transistor. An emitter layer is formed on the base and patterned to form an emitter of the bipolar transistor. After a subsequent anneal operation, the dopant density in the base layer and in the MOS gate are as described above.

DESCRIPTION OF THE VIEWS OF THE DRAWING

FIG. 1A through FIG. 1G are cross sections of an integrated circuit containing a bipolar transistor and an MOS transistor, formed according to an embodiment, depicted in successive stages of fabrication.

DETAILED DESCRIPTION OF EXAMPLE EMBODIMENTS

Figure 1A:
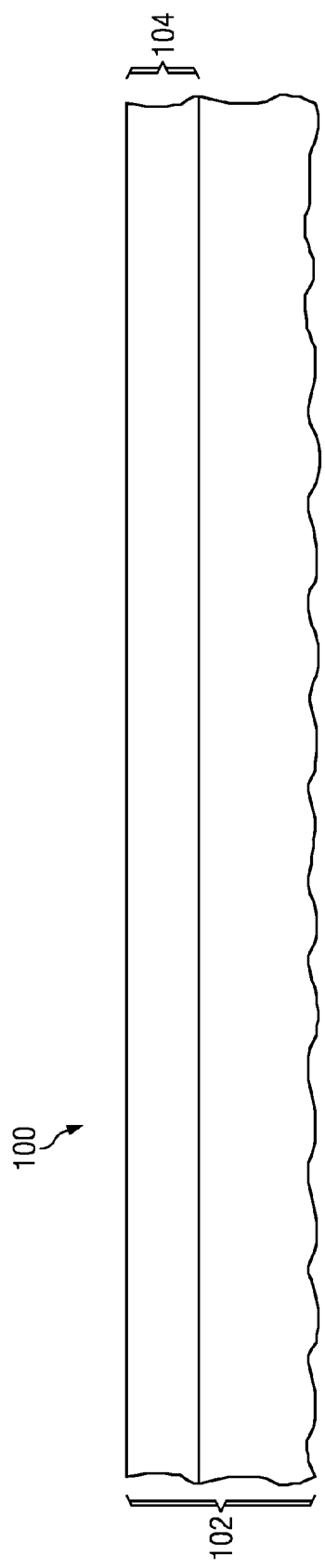

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed so as to include a bipolar transistor and an MOS transistor. The bipolar transistor may have a collector disposed in a substrate of the integrated circuit, abutted by field oxide. The bipolar transistor may further have a base on the collector and overlapping the adjacent field oxide, formed by a non-selective epitaxial process, so that a portion of the base on the collector is crystalline and a portion of the base on the field oxide is polycrystalline. The bipolar transistor may also have an emitter on the base, such that lateral edges of the emitter are disposed above a boundary between the field oxide and the collector at a top surface of the substrate with less than 100 nanometers of lateral displacement. Dopants in the base may be distributed so that a dopant density at the boundary between the field oxide and the collector at the top surface of the substrate is less than half an average doping density in the polycrystalline region of the base over the field oxide. The MOS transistor may have a gate which includes polycrystalline silicon with an average doping density between 80 percent and 125 percent of an average dopant density in the polycrystalline region of the base over the field oxide.

FIG. 1A through FIG. 1G are cross sections of an integrated circuit containing a bipolar transistor and an MOS transistor, formed according to an embodiment, depicted in successive stages of fabrication. Recitation of an exemplary process to form the integrated circuit will describe forming a PNP polarity bipolar transistor and an n-channel polarity MOS transistor. It will be recognized that an integrated circuit containing an NPN polarity bipolar transistor and a p-channel polarity MOS transistor may be formed using a similar process with appropriate changes of polarity of dopants. Referring to FIG. 1A, the integrated circuit 100 is formed in and on a semiconductor substrate 102 which may be a single crystalline silicon wafer, a silicon-on-insulator (SOI) wafer, a hybrid orientation technology (HOT) wafer with regions of different crystal orientations, or other material appropriate for fabrication of the integrated circuit 100. A p-type collector layer 104 is formed at a top surface of the substrate 102, for example by an epitaxial growth process or an ion implantation process and a subsequent anneal operation. The collector layer may be, for example, between 400 nanometers and 600 nanometers thick, and may have an average doping density, for example, less than $1 \times 10^{15}$ cm$^{-3}$. For the purposes of this Description, the substrate 102 will be understood to include the collector layer 104.

Figure 1B:
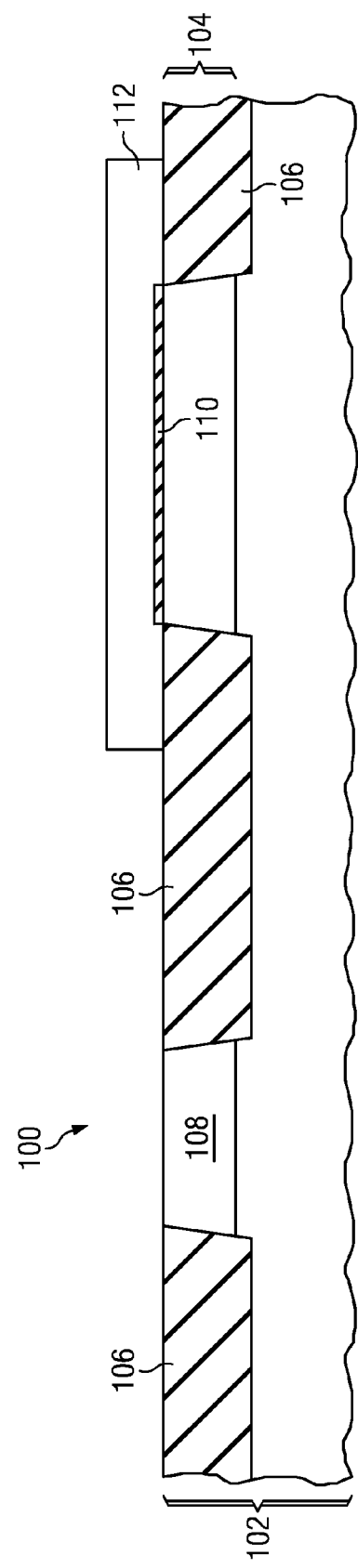

Referring to FIG. 1B, field oxide 106 is formed at a top surface of the substrate 102, for example of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). A portion of the collector layer 104 surrounded by the field oxide 106 provides a collector active area 108 for the bipolar transistor.

A gate dielectric layer 110 is formed at the top surface of the substrate 102 in an area for the MOS transistor. The gate dielectric layer 110 may be one or more layers of silicon dioxide (SiO$_2$), silicon oxy-nitride (SiON), aluminum oxide (Al$_2$O$_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer 110 may include nitrogen as a result of exposure to a nitrogen containing plasma or a nitrogen containing ambient gas at temperatures between 50 C and 800 C. The gate dielectric layer 110 thickness is dependent on a planned gate operating voltage for the MOS transistor. The gate dielectric layer 110 may be formed by any of a variety of gate dielectric formation processes, for example thermal oxidation, plasma nitridation of an oxide layer, and/or dielectric material deposition by atomic layer deposition (ALD).

An MOS gate layer 112 is formed on the gate dielectric layer 110 in the area for the MOS transistor and patterned to expose the collector active area 108. The MOS gate layer 112 includes at least 50 percent silicon, and may be, for example, polycrystalline silicon. The MOS gate layer 112 may be, for example, between 50 nanometers and 1000 nanometers thick. In one version of the instant embodiment, the MOS gate layer 112 may be between 200 nanometers and 300 nanometers thick.

Referring to FIG. 1C, an n-type semiconductor base layer 114 is formed on the collector active area 108 overlapping the adjacent field oxide 106. The base layer 114 is formed by a non-selective epitaxial growth process which provides a single crystalline region 116 on the collector active area 108 and a polycrystalline region 118 on the field oxide 106. The base layer 114 is patterned after the epitaxial growth process, as depicted in FIG. 1C. The base layer 114 may be, for example, between 30 nanometers and 200 nanometers thick. In one version of the instant embodiment, the polycrystalline region 118 may overlap the field oxide 106 between 300 nanometers and 500 nanometers.

Referring to FIG. 1D, an MOS gate layer implant mask 120 is formed over the integrated circuit 100 which includes a portion over the base layer 114 over the collector active area 108 so that lateral edges 122 of the MOS gate layer implant mask 120 are disposed over the field oxide 106 adjacent to the collector active area 108 between 50 nanometers and 150 nanometers past a boundary 124 between the field oxide 106 and the collector active area 108 at the top surface of the substrate 102. The MOS gate layer implant mask 120 may be formed, for example, of photoresist by a photolithographic process. At least a portion of the MOS gate layer 112 over the gate dielectric layer 110 is exposed by the MOS gate layer implant mask 120.

An MOS gate layer ion implantation process 126 is performed which implant n-type dopants into portions of the MOS gate layer 112 and base layer 114 which are exposed by the MOS gate layer implant mask 120. The MOS gate layer ion implantation process 126 may have a dose, for example, between $2 \times 10^{15}$ cm$^{-2}$ and $1 \times 10^{16}$ cm$^{-2}$. The implanted dopants form a gate implanted region 128 in the MOS gate layer 112 over the gate dielectric layer 110 and a base implanted region 130 in the base layer 114 over the field oxide 106. The MOS gate layer implant mask 120 is removed after the MOS gate layer ion implantation process 126 completed, for example by exposing the integrated circuit 100 to an oxygen containing plasma, followed by a wet cleanup to remove any organic residue.

Referring to FIG. 1E, a p-type emitter 138 is formed on the single crystalline region 116 of the base layer 114. Lateral edges 140 of the emitter 138 are disposed near (i.e., within 100 nanometers) of the boundary 124 between the field oxide 106 and the collector active area 108 at the top surface of the substrate 102. In the instant embodiment, the lateral edges 140 of the emitter 138 are disposed outward of the boundary 124 between the field oxide 106 and the collector active area 108.

A base-emitter dielectric stack 142 may be formed and patterned on the base layer 114 prior to forming the emitter 138 so as to provide a defined emitter-base junction area. The base-emitter dielectric stack 142 may be, for example, one or more layers of silicon dioxide, silicon oxy-nitride and/or silicon nitride. Dielectric emitter sidewalls 144 and dielectric base sidewalls 146 may be formed abutting lateral surfaces of the emitter 138 and base layer 114, respectively. The emitter sidewalls 144 and the base sidewalls 146 may be formed, for example, by a process similar to the process used to form the MOS gate sidewalls 136, if present.

The MOS gate layer 112 of FIG. 1D is patterned to form an MOS gate 132 on the gate dielectric layer 110. N-type source/drain extensions 134 may be formed in the substrate 102 adjacent to the MOS gate 132, for example by ion implanting n-type dopants into the substrate 102. An n-channel drain extension implant mask, not shown, may block the drain extension dopants from other areas, such as p-channel transistor areas. In one version of the instant embodiment, the drain extension implant mask may be formed so as to expose a portion of the base layer 114 over the field oxide 106, allowing the polycrystalline region 118 of the base layer 114 to be implanted concurrently with the n-type source/drain extensions 134, so as to advantageously reduce a series resistance of the base layer 114. Another version of the instant embodiment may form the drain extension implant mask so as to block the dopants from the base layer 114, in order to maintain consistent doping of the base layer 114 from batch to batch of instances of the integrated circuit 100, while allowing adjustments in an implant dose of the n-type source/drain extensions 134 from batch to batch so as to advantageously provide flexibility in performance of the MOS transistor with respect to different performance specifications of different batches of the integrated circuit 100.

Dielectric MOS gate sidewalls 136 may be formed abutting lateral surfaces of the MOS gate 132, for example by deposition of one or more conformal layers of silicon nitride and/or silicon dioxide on a top and lateral surfaces of the MOS gate 132 and the top surface of the substrate 102, followed by removal of the conformal layer material from the top surface of the MOS gate 132 and the top surface of the substrate 102 by anisotropic etching methods, leaving the conformal layer material abutting the lateral surfaces of the MOS gate 132. The emitter sidewalls 144 and the base sidewalls 146 may be formed, for example, by a process similar to the process used to form the MOS gate sidewalls 136, if present. The emitter sidewalls 144 and/or the base sidewalls 146 may be formed concurrently with the MOS gate sidewalls 136.

As a result of the processes described in reference to FIG. 1E, the n-type dopants in the gate implanted region 128 and the base implanted region 130 of FIG. 1D diffuse outward. The gate implanted region 128 may expand to fill the MOS gate 132 as depicted in FIG. 1E. The base implanted region 130 expands in the polycrystalline region 118 of the base layer 114 as depicted in FIG. 1E.

Referring to FIG. 1F, a source/drain implant mask 148 is formed over the integrated circuit 100 so as to expose the substrate 102 adjacent to the MOS gate sidewalls 136. The source/drain implant mask 148 includes a portion on the base layer 114 over the collector active area 108 so that lateral edges 150 of the portion of the source/drain implant mask 148 are disposed over the field oxide 106 adjacent to the collector active area 108 between 50 nanometers and 150 nanometers past the boundary 124 between the field oxide 106 and the collector active area 108 at the top surface of the substrate 102. The source/drain implant mask 148 may be formed, for example, of photoresist by a photolithographic process.

A source/drain ion implantation process 152 is performed which implant n-type dopants into the substrate 102 adjacent to the MOS gate sidewalls 136 and the polycrystalline region 118 of the base layer 114 which are exposed by the source/drain implant mask 148. The source/drain ion implantation process 152 may have a dose, for example, between $7 \times 10^{14}$ cm$^{-2}$ and $4 \times 10^{15}$ cm$^{-2}$. The dose of the source/drain ion implantation process 152 may be, for example, a factor between three and ten less than the dose of the MOS gate layer ion implantation process 126. The implanted dopants form source/drain implanted regions 154 in the substrate 102 adjacent to the MOS gate sidewalls 136 and a second base implanted region 156 in the polycrystalline region 118 of the base layer 114 over the field oxide 106. The source/drain implant mask 148 is removed after the source/drain ion implantation process 152 completed, for example by exposing the integrated circuit 100 to an oxygen containing plasma, followed by a wet cleanup to remove any organic residue.

Figure 1G:
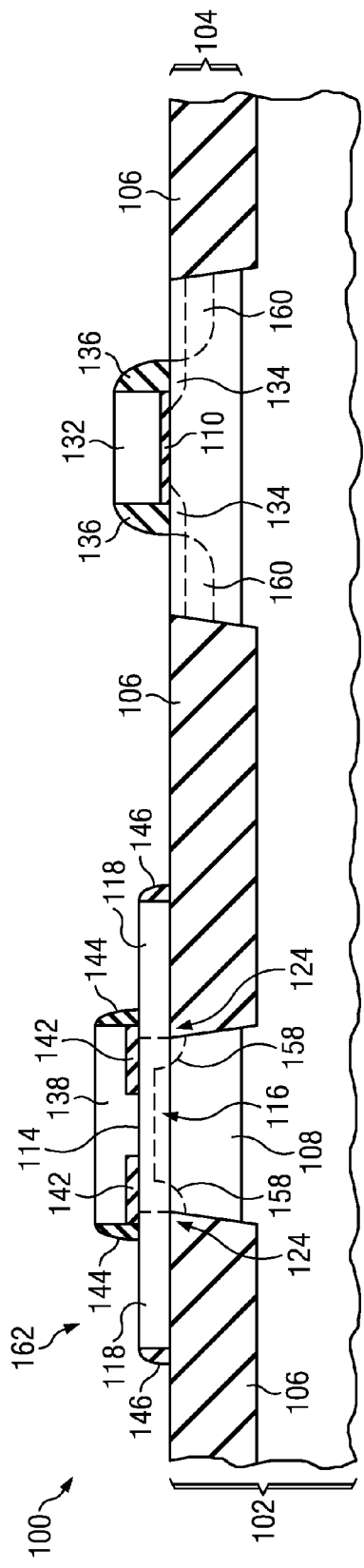

Referring to FIG. 1G, thermal operations such as implant anneals in a fabrication sequence of the integrated circuit 100 cause the dopants implanted in the polycrystalline region 118 of the base layer 114 to diffuse toward the single crystalline region 116 so that a base-collector junction 158 extends into the substrate 102 less than one-third of the depth of the field oxide 106, when no electrical bias is applied to the bipolar transistor 162. The implanted dopants in the source/drain implanted regions 154 diffuse outward to form n-type source/drain regions 160 of the MOS transistor. Additional steps, such as ion implant operations, to provide desired doping profiles in the emitter 138 and collector active area 108 may be performed.

The embodiment described in reference to FIG. 1A through FIG. 1G may provide the bipolar transistor 162 with a thinner base and thus a desired transfer frequency and an advantageously higher base-collector breakdown voltage than a bipolar transistor, not shown, with a same transfer frequency which has a deeper base-collector junction. Implanting the polycrystalline region 118 of the base layer 114 concurrently with the MOS gate layer 112 of FIG. 1D, and possibly with the source/drain regions 160 of the MOS transistor, advantageously reduces a series resistance of the base.

A vertically cumulative doping density, in units of cm$^{-2}$, of the polycrystalline region 118 of the base layer 114 is between 80 percent and 125 percent of a vertically cumulative doping density, also in units of cm$^{-2}$, of the MOS gate 132. The vertically cumulative doping density of the polycrystalline region 118 of the base layer 114 is the local dopant density in the polycrystalline region 118 of the base layer 114 integrated over the thickness of the polycrystalline region 118 of the base layer 114. Similarly, the vertically cumulative doping density of the MOS gate 132 is the local dopant density in the MOS gate 132 integrated over the thickness of the MOS gate 132. In one version of the instant embodiment, the vertically cumulative doping density of the polycrystalline region 118 of the base layer 114 may be between $2 \times 10^{15}$ cm$^{-2}$ and $1.4 \times 10^{16}$ cm$^{-2}$.

Figure 2A:
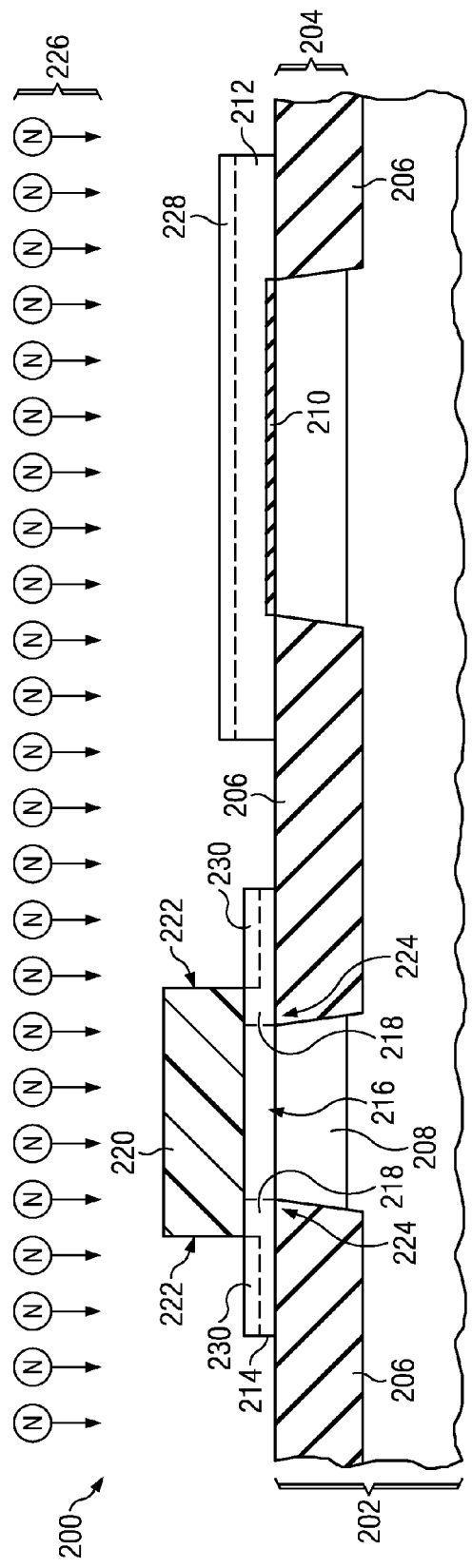
FIG. 2A through FIG. 2C are cross sections of an integrated circuit containing a bipolar transistor and an MOS transistor, formed according to an alternate embodiment, depicted in successive stages of fabrication.
Figure 2B:
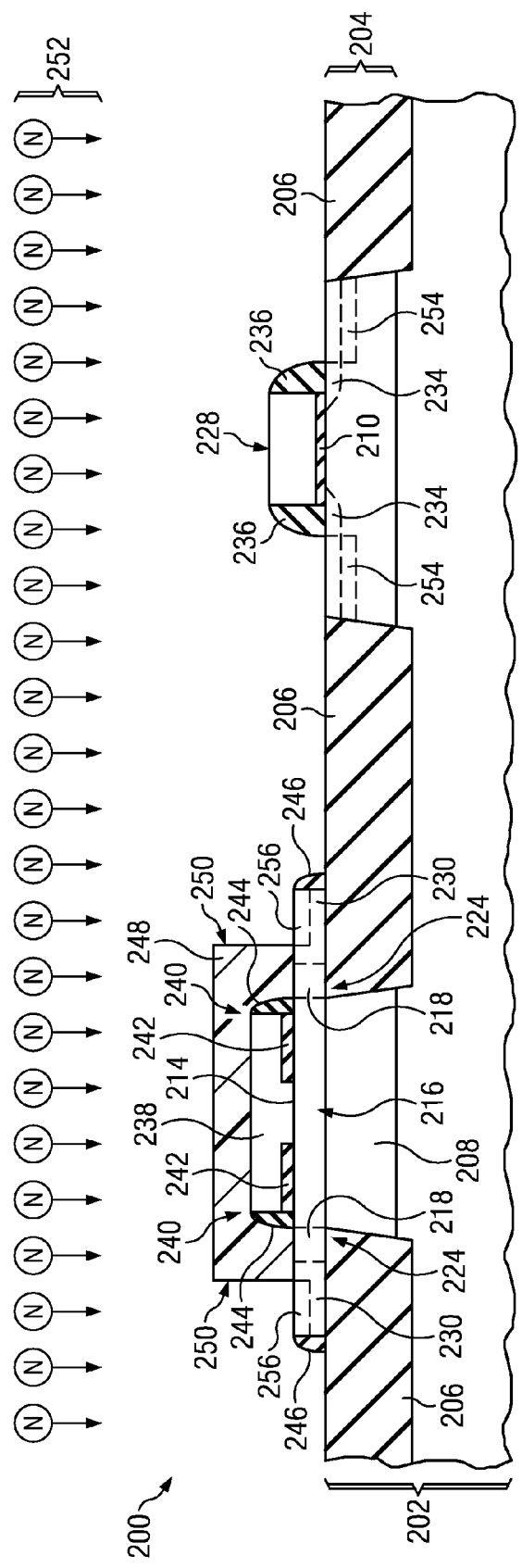
Figure 2C:
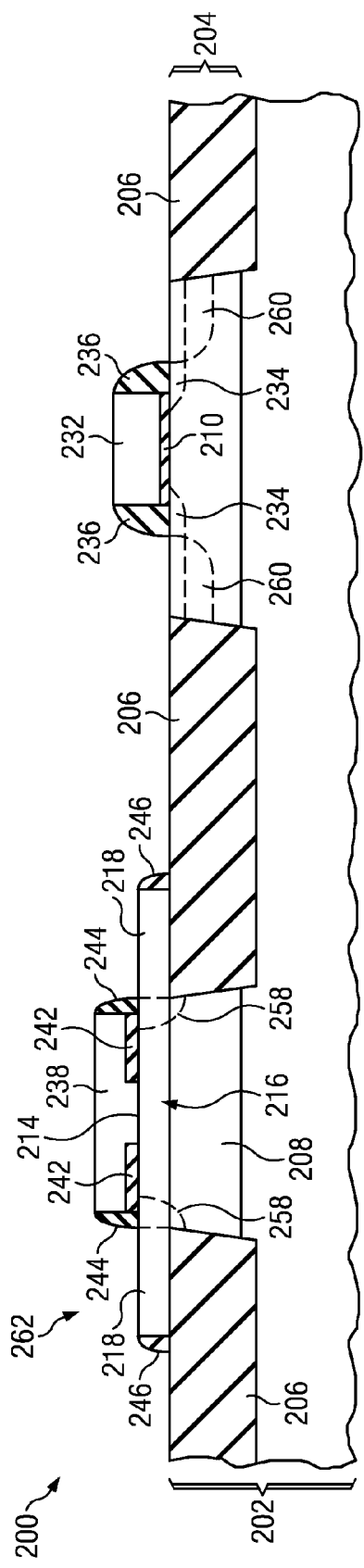

FIG. 2A through FIG. 2C are cross sections of an integrated circuit containing a bipolar transistor and an MOS transistor, formed according to an alternate embodiment, depicted in successive stages of fabrication. Referring to FIG. 2A, the integrated circuit 200 is formed in and on a semiconductor substrate 202 and a p-type collector layer 204 is formed at a top surface of the substrate 202, as described in reference to FIG. 1A. Field oxide 206 is formed at a top surface of the substrate 202 so as to provide a collector active area 208 for the bipolar transistor abutted by field oxide 206.

A gate dielectric layer 210 is formed on the substrate 202 in an area for the MOS transistor, as described in reference to FIG. 1B. An MOS gate layer 212 is formed on the gate dielectric layer 210 and patterned to expose the collector active area 208, as described in reference to FIG. 1B. A semiconductor base layer 214 is formed with a single crystalline region 216 on the collector active area 208 and a polycrystalline region 218 on the adjacent field oxide 206, as described in reference to FIG. 1C.

As described in reference to FIG. 1D, a MOS gate layer implant mask 220 is formed on the base layer 214 over the collector active area 208 so that lateral edges 222 of the MOS gate layer implant mask 220 are disposed over the field oxide 206 adjacent to the collector active area 208 between 50 nanometers and 150 nanometers past a boundary 224 between the field oxide 206 and the collector active area 208 at the top surface of the substrate 202. The MOS gate layer implant mask 220 exposes at least a portion of the MOS gate layer 212 over the gate dielectric layer 210.

An MOS gate layer ion implantation process 226 is performed which implant n-type dopants into portions of the MOS gate layer 212 and base layer 214 which are exposed by the MOS gate layer implant mask 220, as described in reference to FIG. 1D. The implanted dopants form a gate implanted region 228 in the MOS gate layer 212 over the gate dielectric layer 210 and a base implanted region 230 in the base layer 214 over the field oxide 206. The MOS gate layer implant mask 220 is subsequently removed.

Referring to FIG. 2B, the MOS gate layer 212 of FIG. 2A is patterned to form an MOS gate 232 on the gate dielectric layer 210, and n-type source/drain extensions 234 may be formed in the substrate 202 adjacent to the MOS gate 232, as described in reference to FIG. 1E. Dielectric MOS gate sidewalls 236 may be formed abutting lateral surfaces of the MOS gate 232, as described in reference to FIG. 1E.

The n-type dopants in the gate implanted region 228 and the base implanted region 230 of FIG. 2A diffuse outward. The gate implanted region 228 may expand to fill the MOS gate 232 as depicted in FIG. 2B. The base implanted region 230 expands in the polycrystalline region 218 of the base layer 214 as depicted in FIG. 2B.

A p-type emitter 238 is formed on the single crystalline region 216 of the base layer 214, as described in reference to FIG. 1E. Lateral edges 240 of the emitter 238 are disposed within 100 nanometers of the boundary 224 between the field oxide 206 and the collector active area 208 at the top surface of the substrate 202. In the instant embodiment, the lateral edges 240 of the emitter 238 are disposed inward of the boundary 224 between the field oxide 206 and the collector active area 208.

An emitter-base dielectric stack 242 may be formed and patterned on the base layer 214 prior to forming the emitter 238 as described in reference to FIG. 1E so as to provide a defined emitter-base junction area. In the instant embodiment, outer lateral edges of the emitter-base dielectric stack 242 are disposed directly over the boundary 224 between the field oxide 206 and the collector active area 208 at the top surface of the substrate 202. Dielectric emitter sidewalls 244 and dielectric base sidewalls 246 may be formed abutting lateral surfaces of the emitter 238 and base layer 214, respectively. The emitter sidewalls 244 and the base sidewalls 246 may be formed, for example, by a process similar to the process used to form the MOS gate sidewalls 236, if present. The emitter sidewalls 244 and/or the base sidewalls 246 may be formed concurrently with the MOS gate sidewalls 236.

A source/drain implant mask 248 is formed on the integrated circuit 200 so as to expose the substrate 202 adjacent to the MOS gate sidewalls 236, as described in reference to FIG. 1F. The source/drain implant mask 248 includes a portion on the base layer 214 over the collector active area 208 so that lateral edges 250 of the portion of the source/drain implant mask 248 are disposed over the field oxide 206 adjacent to the collector active area 208 between 50 nanometers and 150 nanometers past the boundary 224 between the field oxide 206 and the collector active area 208 at the top surface of the substrate 202.

An source/drain ion implantation process 252 is performed which implant n-type dopants into the substrate 202 adjacent to the MOS gate sidewalls 236 and the polycrystalline region 218 of the base layer 214 which are exposed by the source/drain implant mask 248, as described in reference to FIG. 1F. The implanted dopants form source/drain implanted regions 254 in the substrate 202 adjacent to the MOS gate sidewalls 236 and a second base implanted region 256 in the polycrystalline region 218 of the base layer 214 over the field oxide 206. The source/drain implant mask 248 is subsequently removed.

Referring to FIG. 2C, thermal operations such as implant anneals in a fabrication sequence of the integrated circuit 200 cause the dopants implanted in the polycrystalline region 218 of the base layer 214 to diffuse toward the single crystalline region 216 so that a base-collector junction 258 extends into the substrate 202 less than one-third of the depth of the field oxide 206, when no electrical bias is applied to the bipolar transistor 262. Due to the fact that the emitter edges are disposed inwardly of the field oxide 206/collector 208 boundary, the bipolar transistor 262 may have a desirably lower base series resistance than the bipolar transistor 162 of FIG. 1G, while having an acceptably higher base collector capacitance. The implanted dopants in the source/drain implanted regions 254 diffuse outward to form n-type source/drain regions 260 of the MOS transistor. Additional steps, such as ion implant operations, to provide desired doping profiles in the emitter 238 and collector active area 208 may be performed.

A vertically cumulative doping density, in units of $cm^{-2}$, of the polycrystalline region 218 of the base layer 214 is between 80 percent and 125 percent of a vertically cumulative doping density, also in units of $cm^{-2}$, of the MOS gate 232. The embodiment described in reference to FIG. 2A through FIG. 2C may provide the bipolar transistor 262 with the advantages recited for the embodiment described in reference to FIG. 1A through FIG. 1G.

Figure 3A:
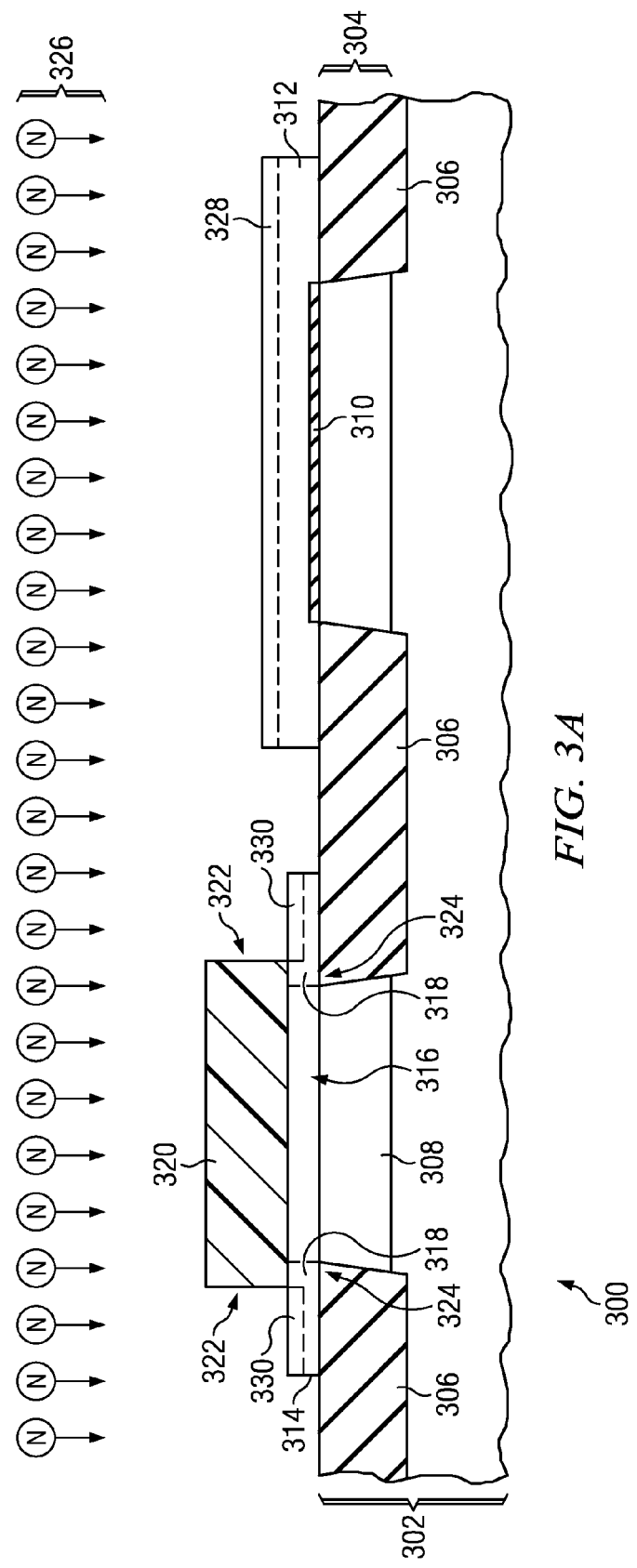
FIG. 3A through FIG. 3C are cross sections of an integrated circuit containing a bipolar transistor and an MOS transistor, formed according to an alternate embodiment, depicted in successive stages of fabrication.
Figure 3B:
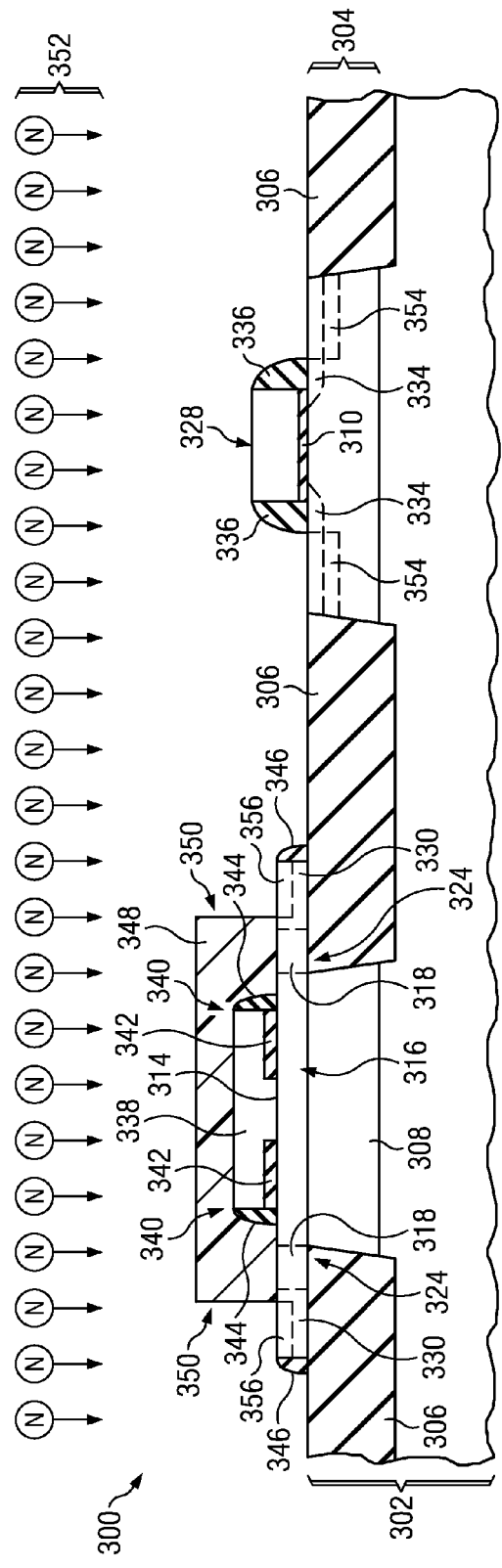
Figure 3C:
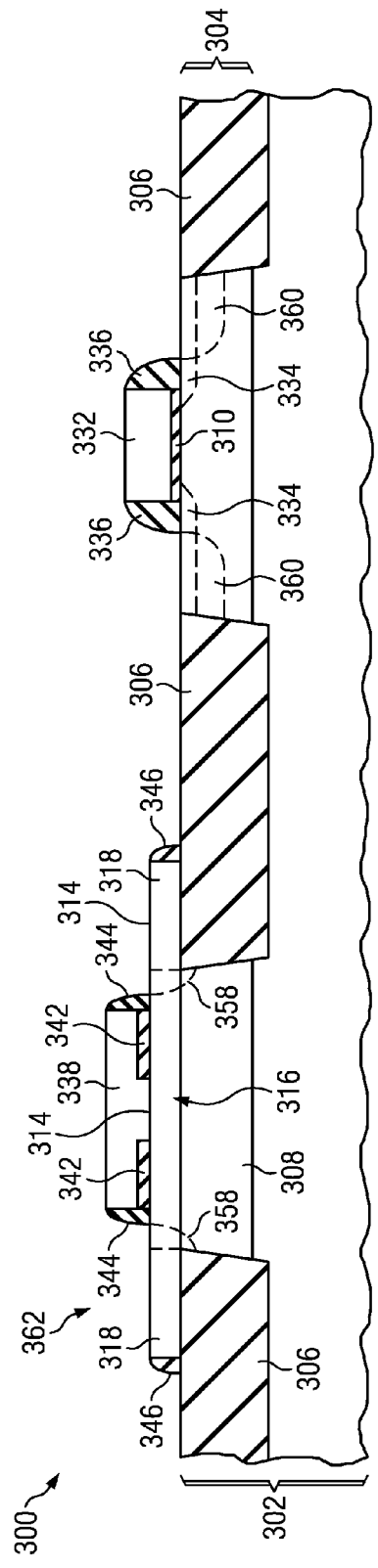

FIG. 3A through FIG. 3C are cross sections of an integrated circuit containing a bipolar transistor and an MOS transistor, formed according to an alternate embodiment, depicted in successive stages of fabrication. Referring to FIG. 3A, the integrated circuit 300 is formed in and on a semiconductor substrate 302 and a p-type collector layer 304 is formed at a top surface of the substrate 302, as described in reference to FIG. 1A. Field oxide 306 is formed at a top surface of the substrate 302 so as to provide a collector active area 308 for the bipolar transistor abutted by field oxide 306.

A gate dielectric layer 310 is formed on the substrate 302 in an area for the MOS transistor, as described in reference to FIG. 1B. An MOS gate layer 312 is formed on the gate dielectric layer 310 and patterned to expose the collector active area 308, as described in reference to FIG. 1B. A semiconductor base layer 314 is formed with a single crystalline region 316 on the collector active area 308 and a polycrystalline region 318 on the adjacent field oxide 306, as described in reference to FIG. 1C.

As described in reference to FIG. 1D, a MOS gate layer implant mask 320 is formed on the base layer 314 over the collector active area 308 so that lateral edges 322 of the MOS gate layer implant mask 320 are disposed over the field oxide 306 adjacent to the collector active area 308 between 50 nanometers and 150 nanometers past a boundary 324 between the field oxide 306 and the collector active area 308 at the top surface of the substrate 302. The MOS gate layer implant mask 320 exposes at least a portion of the MOS gate layer 312 over the gate dielectric layer 310.

An MOS gate layer ion implantation process 326 is performed which implant n-type dopants into portions of the MOS gate layer 312 and base layer 314 which are exposed by the MOS gate layer implant mask 320, as described in reference to FIG. 1D. The implanted dopants form a gate implanted region 328 in the MOS gate layer 312 over the gate dielectric layer 310 and a base implanted region 330 in the base layer 314 over the field oxide 306. The MOS gate layer implant mask 320 is subsequently removed.

Referring to FIG. 3B, the MOS gate layer 312 of FIG. 3A is patterned to form an MOS gate 332 on the gate dielectric layer 310, and n-type source/drain extensions 334 may be formed in the substrate 302 adjacent to the MOS gate 332, as described in reference to FIG. 1E. Dielectric MOS gate sidewalls 336 may be formed abutting lateral surfaces of the MOS gate 332, as described in reference to FIG. 1E.

The n-type dopants in the gate implanted region 328 and the base implanted region 330 of FIG. 3A diffuse outward. The gate implanted region 328 may expand to fill the MOS gate 332 as depicted in FIG. 3B. The base implanted region 330 expands in the polycrystalline region 318 of the base layer 314 as depicted in FIG. 3B.

A p-type emitter 338 is formed on the single crystalline region 316 of the base layer 314 as described in reference to FIG. 1E. Lateral edges 340 of the emitter 338 are disposed within 100 nanometers of the boundary 324 between the field oxide 306 and the collector active area 308 at the top surface of the substrate 302. In the instant embodiment, the lateral edges 340 of the emitter 338 are disposed inward of the boundary 324 between the field oxide 306 and the collector active area 308.

An emitter-base dielectric stack 342 may be formed on the base layer 314 prior to forming the emitter 338 as described in reference to FIG. 1E so as to provide a defined emitter-base junction area. In the instant embodiment, outer lateral edges of the emitter-base dielectric stack 342 are disposed inward of the boundary 324 between the field oxide 306 and the collector active area 308 at the top surface of the substrate 302. Dielectric emitter sidewalls 344 and dielectric base sidewalls 346 may be formed abutting lateral surfaces of the emitter 338 and base layer 314, respectively. The emitter sidewalls 344 and the base sidewalls 346 may be formed, for example, by a process similar to the process used to form the MOS gate sidewalls 336, if present. The emitter sidewalls 344 and/or the base sidewalls 346 may be formed concurrently with the MOS gate sidewalls 336.

A source/drain implant mask 348 is formed on the integrated circuit 300 so as to expose the substrate 302 adjacent to the MOS gate sidewalls 336, as described in reference to FIG. 1F. The source/drain implant mask 348 includes a portion on the base layer 314 over the collector active area 308 so that lateral edges 350 of the portion of the source/drain implant mask 348 are disposed over the field oxide 306 adjacent to the collector active area 308 between 50 nanometers and 150 nanometers past the boundary 324 between the field oxide 306 and the collector active area 308 at the top surface of the substrate 302.

An source/drain ion implantation process 352 is performed which implant n-type dopants into the substrate 302 adjacent to the MOS gate sidewalls 336 and the polycrystalline region 318 of the base layer 314 which are exposed by the source/drain implant mask 348, as described in reference to FIG. 1F. The implanted dopants form source/drain implanted regions 354 in the substrate 302 adjacent to the MOS gate sidewalls 336 and a second base implanted region 356 in the polycrystalline region 318 of the base layer 314 over the field oxide 306. The source/drain implant mask 348 is subsequently removed.

Referring to FIG. 3C, thermal operations such as implant anneals in a fabrication sequence of the integrated circuit 300 cause the dopants implanted in the polycrystalline region 318 of the base layer 314 to diffuse toward the single crystalline region 316 so that a base-collector junction 358 extends into the substrate 302 less than one-third of the depth of the field oxide 306, when no electrical bias is applied to the bipolar transistor 362. Due to the fact that the emitter edges are disposed inwardly of the field oxide 306/collector 308 boundary, the bipolar transistor 362 may have a desirably lower base series resistance than the bipolar transistor 262 of FIG. 2C, while having an acceptably higher base collector capacitance. The implanted dopants in the source/drain implanted regions 354 diffuse outward to form n-type source/drain regions 360 of the MOS transistor. Additional steps, such as ion implant operations, to provide desired doping profiles in the emitter 338 and collector active area 308 may be performed.

A vertically cumulative doping density, in units of $cm^{-2}$, of the polycrystalline region 318 of the base layer 314 is between 80 percent and 125 percent of a vertically cumulative doping density, also in units of $cm^{-2}$, of the MOS gate 332. The embodiment described in reference to FIG. 3A through FIG. 3C may provide the bipolar transistor 362 with the advantages recited for the embodiment described in reference to FIG. 1A through FIG. 1G.

What is claimed is:

1. A process of forming an integrated circuit having a bipolar transistor and a metal oxide semiconductor (MOS) transistor, comprising the steps of:
   providing a substrate comprising a semiconductor;
   forming a semiconductor collector layer at a top surface of said substrate, such that said collector layer has a first conductivity type;
   forming field oxide at said top surface of said substrate, so that said field oxide surrounds a collector active area of said bipolar transistor, the field oxide and the collector active area having a boundary therebetween;
   forming an MOS gate layer in an area for said MOS transistor;
   forming a base layer of semiconductor material on said collector active area and overlapping said field oxide adjacent to said collector active area, using a non-selective epitaxial growth process, such that said base layer has a polycrystalline region over said field oxide and has a single crystalline region on said collector active area;
   forming a first implant mask over said integrated circuit, so that at least a portion of said MOS gate layer is exposed, and so that the single crystalline region of said base layer is covered, and so that a first portion of the polycrystalline region of the base layer is exposed and a second portion of the polycrystalline region of the base layer is covered;
   performing an MOS gate layer ion implantation process so as to implant dopants of a second conductivity type opposite from said first conductivity type into portions of said MOS gate layer and said base layer which are exposed by said first implant mask, so as to form a gate implanted region in said MOS gate layer and a first base implanted region in said base layer over said field oxide;
   forming an emitter of said bipolar transistor on said single crystalline region of said base layer, said emitter having said first conductivity type; and
   performing a thermal operation on said integrated circuit, so as to cause said dopants implanted in said polycrystalline region of said base layer to diffuse toward said single crystalline region so that a base-collector junction of said bipolar transistor extends into said substrate less than one-third of a depth of said field oxide.

2. The process of claim 1, in which:
   said bipolar transistor is a PNP bipolar transistor; and
   said MOS transistor is an n-channel MOS transistor.

3. The process of claim 1, in which said step of forming said emitter is performed so that lateral edges of said emitter are disposed outward of said boundary between said field oxide and said collector active area; and
   including a step of forming dielectric sidewalls abutting lateral surfaces said emitter.

4. The process of claim 1, in which said step of forming said emitter is performed so that lateral edges of said emitter are disposed inward of said boundary between said field oxide and said collector active area; and
   including a step of forming dielectric sidewalls abutting lateral surfaces said emitter, so that outer lateral edges of said emitter sidewalls are disposed directly over said boundary between said field oxide and said collector.

5. The process of claim 1, in which said step of forming said emitter is performed so that lateral edges of said emitter are disposed inward of said boundary between said field oxide and said collector active area; and
   including a step of forming dielectric sidewalls abutting lateral surfaces said emitter, so that outer lateral edges of said emitter sidewalls are disposed inward of said boundary between said field oxide and said collector.

6. The process of claim 1, in which lateral edges of said emitter are disposed within 100 nanometers of said boundary between said field oxide and said collector active area at said top surface of said substrate.

7. The process of claim 1, in which said a dose of said MOS gate layer ion implantation process is between $2\times10^{15}$ cm$^{-2}$ and $1\times10^{16}$ cm$^{-2}$.

8. The process of claim 1, including the steps of:

forming a second implant mask after a further step of forming MOS gate sidewalls, so that said second implant mask exposes said substrate adjacent to said MOS gate sidewalls, and so that said second implant mask includes a portion on said base layer over said collector active area so that lateral edges of said portion of said second implant mask are disposed over said field oxide adjacent to said collector active area between 50 nanometers and 150 nanometers past said boundary between said field oxide and said collector active area at said top surface of said substrate; and performing a source/drain ion implantation process so as to implant dopants of said second conductivity type into said substrate adjacent to said MOS gate sidewalls and said polycrystalline region of said base layer which are exposed by said second implant mask, so as to form source/drain implanted regions in said substrate adjacent to said MOS gate sidewalls and a second base implanted region in said polycrystalline region of said base layer over said field oxide.

9. The process of claim 8, in which said a dose of said source/drain ion implantation process is between $7\times10^{14}$ cm$^{-2}$ and $4\times10^{15}$ cm$^{-2}$.

10. The process of claim 1, in which said base layer is between 30 nanometers and 200 nanometers thick.

11. The process of claim 1, in which said collector layer is between 400 nanometers and 600 nanometers thick.

* * * * *